United States Patent
Konno et al.

(10) Patent No.: US 8,076,777 B2
(45) Date of Patent: Dec. 13, 2011

(54) GLASS COMPOSITIONS USED IN CONDUCTORS FOR PHOTOVOLTAIC CELLS

(75) Inventors: Takuya Konno, Tochigi-ken (JP); Brian J. Laughlin, Apex, NC (US); Hisashi Matsuno, Tokyo (JP)

(73) Assignee: E. I. du Pont de Nemours and Company, Wilmington, DE (US)

( * ) Notice: Subject to any disclaimer, the term of this patent is extended or adjusted under 35 U.S.C. 154(b) by 263 days.

(21) Appl. No.: 12/479,965

(22) Filed: Jun. 8, 2009

(65) Prior Publication Data

US 2010/0308462 A1 Dec. 9, 2010

Related U.S. Application Data

(60) Provisional application No. 61/075,826, filed on Jun. 26, 2008, provisional application No. 61/078,888, filed on Jul. 8, 2008, provisional application No. 61/107,035, filed on Oct. 21, 2008, provisional application No. 61/113,701, filed on Nov. 12, 2008, provisional application No. 61/140,235, filed on Dec. 23, 2008, provisional application No. 61/143,525, filed on Jan. 9, 2009, provisional application No. 61/150,044, filed on Feb. 5, 2009.

(51) Int. Cl.
*H01L 23/48* (2006.01)
*H01B 1/02* (2006.01)
*B32B 17/06* (2006.01)

(52) U.S. Cl. ......... 257/741; 257/E21.295; 257/E29.143; 252/519.3; 252/512; 252/513; 252/514; 428/426; 428/427; 428/428

(58) Field of Classification Search .................. 257/741, 257/E21.295, E29.143; 136/252, 262; 252/519.3, 252/512, 513, 514; 501/6, 11, 17, 18, 19; 428/420, 426–435, 446

See application file for complete search history.

(56) References Cited

U.S. PATENT DOCUMENTS

| | | |
|---|---|---|
| 2006/0001009 A1 | 1/2006 | Garreau-Iles et al. |
| 2006/0231800 A1 | 10/2006 | Wang et al. |
| 2006/0231801 A1 | 10/2006 | Carroll et al. |
| 2006/0231804 A1 | 10/2006 | Wang et al. |
| 2009/0101199 A1* | 4/2009 | Carroll et al. ................. 136/252 |
| 2009/0266409 A1* | 10/2009 | Wang et al. ................... 136/252 |
| 2010/0126565 A1* | 5/2010 | Takeda et al. ................. 136/252 |
| 2010/0275997 A1* | 11/2010 | Young et al. .................. 136/258 |

FOREIGN PATENT DOCUMENTS

| | | |
|---|---|---|
| EP | 1298099 A1 | 4/2003 |
| JP | 2004-174683 A | 6/2005 |
| JP | 2007-246311 A | 9/2007 |

OTHER PUBLICATIONS

International Search Report for International Application No. PCT/US2009/046573 Dated Sep. 17, 2009.

* cited by examiner

*Primary Examiner* — Jasmine Clark

(57) ABSTRACT

The invention relates to glass compositions useful in conductive pastes for silicon semiconductor devices and photovoltaic cells. The thick film conductor compositions include one or more electrically functional powders and one or more glass frits dispersed in an organic medium. The thick film compositions may also include one or more additive(s). Exemplary additives may include metals, metal oxides or any compounds that can generate these metal oxides during firing.

15 Claims, No Drawings

GLASS COMPOSITIONS USED IN CONDUCTORS FOR PHOTOVOLTAIC CELLS

CROSS REFERENCES TO RELATED APPLICATIONS

This application claims priority under 35 U.S.C. 119(e) to the following U.S. Provisional Application Numbers:
61/075,826, filed Jun. 26, 2008
61/078,888, filed Jul. 8, 2008
61/107,035, filed Oct. 21, 2008
61/113,701, filed Nov. 12, 2008
61/140,235, filed Dec. 23, 2008
61/143,525, filed Jan. 9, 2009
61/150,044, filed Feb. 5, 2009

FIELD OF THE INVENTION

Embodiments of the invention relate to a silicon semiconductor device, and a conductive silver paste containing glass frit for use in a solar cell device.

TECHNICAL BACKGROUND OF THE INVENTION

A conventional solar cell structure with a p-type base has a negative electrode that may be on the front-side or sun side of the cell and a positive electrode that may be on the opposite side. Radiation of an appropriate wavelength falling on a p-n junction of a semiconductor body serves as a source of external energy to generate hole-electron pairs in that body. Because of the potential difference which exists at a p-n junction, holes and electrons move across the junction in opposite directions and thereby give rise to flow of an electric current that is capable of delivering power to an external circuit. Most solar cells are in the form of a silicon wafer that has been metalized, i.e., provided with metal contacts that are electrically conductive.

There is a need for compositions, structures (for example, semiconductor, solar cell or photodiode structures), and semiconductor devices (for example, semiconductor, solar cell or photodiode devices) which have improved electrical performance, and methods of making.

SUMMARY OF THE INVENTION

An embodiment of the invention relates to a composition including: (a) one or more electrically conductive materials, (b) one or more glass frits which include 7-25 wt % of $SiO_2$, 55-90 wt % of $Bi_2O_3$, 0.5-5 wt % of $B_2O_3$, 1.5 to 8 wt % of one or more alkali metal oxides; 1-8 wt % of $ZrO_2$; and organic medium. In an aspect of this embodiment, the composition may include 11-25 wt % of $SiO_2$. In an aspect, the alkali metal oxides may be selected from the group consisting of: $Na_2O$, $Li_2O$, and mixtures thereof. The composition may further include one or more additives selected from the group consisting of: (a) a metal wherein said metal is selected from Zn, Pb, Bi, Gd, Ce, Zr, Ti, Mn, Sn, Ru, Co, Fe, Cu, and Cr; (b) a metal oxide of one or more of the metals selected from Zn, Pb, Bi, Gd, Ce, Zr, Ti, Mn, Sn, Ru, Co, Fe, Cu and Cr; (c) any compounds that can generate the metal oxides of (b) upon firing; and (d) mixtures thereof.

Another aspect of the invention relates to a method of manufacturing a semiconductor device including the steps of: (a) providing a semiconductor substrate, one or more insulating films, and the thick film composition: (b) applying the insulating film to the semiconductor substrate, (c) applying the thick film composition to the insulating film on the semiconductor substrate, and (d) firing the semiconductor, insulating film and thick film composition.

Another aspect of the invention relates to a solar cell including a semiconductor device including a semiconductor substrate, an insulating film, and an electrode, wherein the front-side electrode includes glass frit containing 7-25 wt % of $SiO_2$, 55-90 wt % of $Bi_2O_3$, 0.5-5 wt % of $B_2O_3$, 1.5 to 8 wt % of one or more alkali metal oxides; 1-8 wt % of $ZrO_2$.

DETAILED DESCRIPTION OF THE INVENTION

The thick film conductor compositions described herein include one or more electrically functional powders and one or more glass frits dispersed in an organic medium. The thick film compositions may also include one or more additive(s). Exemplary additives may include metals, metal oxides or any compounds that can generate these metal oxides during firing. An aspect of the invention relates to one or more glass frits useful in thick film conductor composition(s). In an embodiment, these thick film conductor composition(s) are for use in a semiconductor device. In an aspect of this embodiment, the semiconductor device may be a solar cell or a photodiode. An embodiment relates to a broad range of semiconductor devices. An embodiment relates to light-receiving elements such as photodiodes and solar cells.

Glass Frits

An embodiment relates to glass frit compositions (also termed glass frits, or glass compositions herein). Exemplary glass frit compositions are listed in Tables 1-4 below. The glass compositions listed in Tables 1-4 are not limiting. It is contemplated that one of ordinary skill in the art of glass chemistry could make minor substitutions of additional ingredients and not substantially change the desired properties of the glass composition of this invention. For example, substitutions of glass formers such as $P_2O_5$ 0-3, $GeO_2$ 0-3, $V_2O_5$ 0-3 in weight % may be used either individually or in combination to achieve similar performance. For example, one or more intermediate oxides, such as $TiO_2$, $Ta_2O_5$, $Nb_2O_5$, $ZrO_2$, $CeO_2$, and $SnO_2$ may be substituted for other intermediate oxides (i.e., $Al_2O_3$, $CeO_2$, $SnO_2$) present in a glass composition of this invention.

An exemplary method for producing the glass frits described herein is by conventional glass making techniques. Ingredients are weighed then mixed in the desired proportions and heated in a furnace to form a melt in platinum alloy crucibles. As well known in the art, heating is conducted to a peak temperature (80-140° C.) and for a time such that the melt becomes entirely liquid and homogeneous. The molten glass is then quenched between counter rotating stainless steel rollers to form a 10-15 mil thick platelet of glass. The resulting glass platelet was then milled to form a powder with its 50% volume distribution set between to a desired target (e.g. 0.8-1.5 μm). One skilled in the art may employ alternative synthesis techniques such as but not limited to water quenching, sol-gel, spray pyrolysis, or others appropriate for making powder forms of glass.

In an embodiment, the glass frit includes $SiO_2$, PbO, and ZnO, which, in an embodiment, may be approximately equal molar ratio. In an aspect of this embodiment, a portion of the frit in the thick film composition may devitrify upon firing, resulting in crystallization of larsenite ($PbZnSiO_4$).

In another embodiment, the glass frit may include other chemical constituents, such as but not limited to iron oxides, manganese oxides, chromium oxides, rare earth oxides, MgO, BeO, SrO, BaO, or CaO. Without being bound by theory, it is speculated that in an embodiment in which CaO is added to the composition, esperite (also termed calcium larsenite, $PbCa_3Zn_4(SiO_4)_4$) may form upon devitrification.

In a further embodiment, the glass frit may include a glass-ceramic where the remnant glass after ceramming may have a specific chemistry; for example, glass #11 of table I may, in an embodiment, have a minimal silica content in the remnant glass after ceramming.

Exemplary embodiments related to the glass compositions, in weight percent total glass composition, are shown in Table 1. These glass frit compositions were made according to methods described herein. Unless stated otherwise, as used herein, wt % means wt % of glass composition only. In an embodiment, the glass frits may include one or more of $SiO_2$, $Al_2O_3$, PbO, $B_2O_3$, CaO, ZnO, or $Na_2O$, $Ta_2O_5$, or $Li_2O$. In aspects of this embodiment, the: $SiO_2$ may be 10 to 30 wt %, 15 to 25 wt %, or 17 to 19 wt %, $Al_2O_3$ may be 0 to 11 wt %, 1 to 7 wt %, or 1.5 to 2.5 wt %, PbO may be 40 to 70 wt %, 45 to 60 wt %, or 50 to 55 wt %, $B_2O_3$ may be 0 to 5 wt %, 1 to 4 wt %, or 3 to 4 wt %, CaO may be 0 to 30 wt %, 0.1 to 30 wt %, or 0.1 to 1 wt %, ZnO may be 0 to 30 wt %, 15 to 30 wt %, or 16 to 22 wt %, $Na_2O$ may be 0 to 2 wt %, 0.1 to 1 wt %, or 0.2 to 0.5 wt %, $Ta_2O_5$ may be 0 to 5 wt %, 0 to 4 wt %, or 3 to 4 wt %, $Li_2O$ may be 0 to 2 wt %, 0.1 to 1 wt %, or 0.5 to 0.75 wt %, based on the weight of the total glass composition. The glass frit could also be expressed in mol % according to the crystallization of larsenite ($PbZnSiO_4$) described above. In mol percent, the glass frit may include 25-45 mol % of $SiO_2$, 15-35 mol % of PbO, and 15-35 mol % of ZnO. In an embodiment, $SiO_2$, PbO, and ZnO may have approximately equal molar ratio.

One skilled the art of making glass could replace some or all of the $Na_2O$ or $Li_2O$ with $K_2O$, $Cs_2O$, or $Rb_2O$ and create a glass with properties similar to the compositions listed above where this embodiment the total alkali metal oxide content may be 0 to 2 wt %, 0.1 to 1 wt %, or 0.75 to 1 wt %. Further still in this embodiment the total amount of ZnO and CaO may be 10 to 30 wt %, 15 to 25 wt %, or 19 to 22 wt %. Exemplary, non-limiting, alkali metal oxides include sodium oxide, $Na_2O$, lithium oxide, $Li_2O$, potassium oxide, $K_2O$, rubidium oxide, $Rb_2O$, and cesium oxide, $Cs_2O$.

In an embodiment, the glass frit may have a softening point of between 500-600° C.

In an embodiment, the glass frit may have a high percentage of Pb. In an aspect of this embodiment, precipitation of metallic Pb upon firing may occur; in an aspect of this embodiment, electrical contact between the sintered electrical functional powders and the semiconductor substrate may be improved. Exemplary embodiments related to the glass compositions, in weight percent total glass composition, are shown in Table 2. These glass compositions were made according to methods described herein. In an embodiment, the glass frits may include one or more of $SiO_2$, $Al_2O_3$, $ZrO_2$, $B_2O_3$, PbO, ZnO, or $Na_2O$, or $Li_2O$. In aspects of this embodiment, the: $SiO_2$ may be 5 to 36 wt %, 12 to 30 wt %, or 15 to 25 wt %, $Al_2O_3$ may be 0.1 to 10 wt %, 0.2 to 5 wt %, or 0.2 to 0.4 wt %, $ZrO_2$ may be 0 to 2.5 wt %, 0.1 to 1 wt %, or 0.25 to 0.75 wt %, $B_2O_3$ may be 0 to 22 wt %, 0.1 to 5 wt %, or 0.5 to 3 wt %, PbO may be 65 to 90 wt %, 70 to 85 wt %, or 75 to 80 wt %, ZnO may be 0 to 50 wt %, 30 to 50 wt %, or 40 to 50 wt %, $Na_2O$ may be 0 to 3 wt %, 0.1 to 3 wt %, or 1 to 2 wt %, $Li_2O$ may be 0 to 3 wt %, 0.1 to 3 wt %, or 1.25 to 2.25 wt %, based on the weight of the total glass composition.

One skilled the art of making glass could replace some or all of the $Na_2O$ or $Li_2O$ with $K_2O$, $Cs_2O$, or $Rb_2O$ and create a glass with properties similar to the compositions listed above where this embodiment the total alkali metal oxide content may be 0 to 5 wt %, 2 to 4 wt %, or 2 to 3 wt %

In an embodiment, the glass frit may have a softening point of between 400-600° C.

TABLE 2

| | Glass Compositions in weight percent (wt %) | | | | |
|---|---|---|---|---|---|
| ID # | $SiO_2$ | $Al_2O_3$ | PbO | $B_2O_3$ | $ZrO_2$ |
| 19 | 20.15 | 0.26 | 79.08 | — | 0.51 |
| 20 | 24.20 | 0.46 | 74.94 | — | 0.40 |
| 21 | 17.58 | 0.41 | 81.65 | — | 0.36 |
| 22 | 14.78 | 0.39 | 84.49 | — | 0.34 |
| 23 | 19.60 | 0.99 | 76.93 | 1.99 | 0.50 |
| 24 | 17.45 | 1.17 | 81.03 | — | 0.36 |
| 25 | 12.80 | 0.40 | 81.43 | 4.96 | 0.40 |
| 26 | 15.77 | 0.41 | 81.53 | 1.88 | 0.41 |
| 27 | 11.32 | 0.37 | 86.06 | 1.89 | 0.37 |
| 28 | 13.27 | 0.38 | 85.97 | — | 0.38 |

TABLE I

| | Glass Compositions in weight percent (wt %) | | | | | | | | | | |
|---|---|---|---|---|---|---|---|---|---|---|---|
| ID # | $SiO_2$ | $Al_2O_3$ | PbO | $B_2O_3$ | CaO | ZnO | MgO | $Na_2O$ | FeO | $Li_2O$ | $Ta_2O_5$ |
| 1 | 14.4 | 6.6 | 56.2 | — | — | 19.6 | — | — | — | — | 3.2 |
| 2 | 14.9 | 6.8 | 58.1 | — | — | 20.3 | — | — | — | — | — |
| 3 | 14.7 | 6.0 | 56.4 | 2.3 | — | 20.6 | — | — | — | — | — |
| 4 | 16.1 | — | 59.8 | 2.3 | — | 21.8 | — | — | — | — | — |
| 5 | 14.5 | 5.9 | 54.0 | 2.3 | — | 19.7 | — | — | — | — | 3.6 |
| 6 | 14.8 | 7.8 | 55.0 | 2.4 | — | 20.1 | — | — | — | — | — |
| 7 | 14.5 | 9.6 | 53.9 | 2.4 | — | 19.7 | — | — | — | — | — |
| 8 | 14.7 | 6.2 | 54.5 | 4.8 | — | 19.9 | — | — | — | — | — |
| 9 | 17.2 | 6.3 | 53.4 | 3.7 | — | 19.5 | — | — | — | — | — |
| 10 | 18.6 | 6.3 | 53.2 | 2.5 | — | 19.4 | — | — | — | — | — |
| 11 | 15.6 | 6.0 | 56.6 | 2.3 | — | 19.5 | — | — | — | — | — |
| 12 | 20.0 | 10.5 | 47.9 | 4.1 | — | 17.5 | — | — | — | — | — |
| 13 | 18.6 | 2.0 | 54.0 | 3.6 | 0.5 | 20.4 | — | 0.3 | — | 0.6 | — |
| 14 | 18.6 | 2.0 | 53.8 | 3.5 | — | 21.1 | — | 0.3 | — | 0.6 | — |
| 15 | 19.9 | 2.1 | 57.6 | 3.8 | 15.6 | — | — | 0.3 | — | 0.6 | — |
| 16 | 19.9 | 2.1 | 57.5 | 3.8 | 15.0 | 0.8 | — | 0.3 | — | 0.6 | — |
| 17 | 18.7 | 2.0 | 54.2 | 3.6 | 0.5 | 20.5 | — | 0.2 | — | 0.3 | — |
| 18 | 18.8 | 2.0 | 54.3 | 3.6 | 0.5 | 20.6 | — | 0.1 | — | 0.2 | — |

TABLE 2-continued

| | Glass Compositions in weight percent (wt %) | | | | |
|---|---|---|---|---|---|
| ID # | $SiO_2$ | $Al_2O_3$ | PbO | $B_2O_3$ | $ZrO_2$ |
| 29 | 28.40 | 3.73 | 67.87 | — | — |
| 30 | 29.21 | 0.49 | 69.80 | — | 0.50 |

An embodiment relates to lead-free glass frits. Exemplary embodiments related to the glass compositions, in weight percent total glass composition, are shown in Table 3. These glass frit compositions were made according to methods described herein. In an embodiment, glass frits compositions described herein may include one or more of $SiO_2$, $Al_2O_3$, $B_2O_3$, $Na_2O$, $Li_2O$, $ZrO_2$, $Bi_2O_3$, or $TiO_2$. In aspects of this embodiment, the: $SiO_2$ may be 7 to 25 wt %, 15 to 24 wt %, or 20 to 22 wt %, $Al_2O_3$ may be 0 to 1 wt %, 0 to 0.3 wt %, or 0.1 to 0.3 wt %, $B_2O_3$ may be 0.5 to 5 wt %, 0.8 to 4.5 wt %, or 3 to 4 wt %, $Na_2O$ may be 0.1 to 4 wt %, 0.5 to 3 wt %, or 1.5 to 2.5 wt %, $Li_2O$ may be 0.1 to 4 wt %, 0.5 to 3 wt %, or 1.5 to 2.5 wt %. $ZrO_2$ may be 1 to 8 wt %, 1.25 to 6 wt %, or 4 to 5 wt %, $Bi_2O_3$ may be 55 to 90 wt %, 60 to 80 wt %, or 60 to 70 wt %, $TiO_2$ may be 0 to 5 wt %, 0 to 3 wt %, or 1.5 to 2.5 wt %, based on the weight percent of the total glass composition.

One skilled the art of making glass could replace some or all of the $Na_2O$ or $Li_2O$ with $K_2O$, $Cs_2O$, or $Rb_2O$ and create a glass with properties similar to the compositions listed above where this embodiment the total alkali metal oxide content may be 0 to 8 wt %, 1.5 to 5 wt %, or 4 to 5 wt %

In a further embodiment, the glass frit composition(s) herein may include one or more of an additional set of components: $CeO_2$, $SnO_2$, $Ga_2O_3$, $In_2O_3$, NiO, $MoO_3$, $WO_3$, $Y_2O_3$, $La_2O_3$, $Nd_2O_3$, FeO, $HfO_2$, $Cr_2O_3$, CdO, $Nb_2O_5$, $Ag_2O$, $Sb_2O_3$, and metal halides (e.g. NaCl, KBr, NaI).

One of skill in the art would recognize that the choice of raw materials could unintentionally include impurities that may be incorporated into the glass during processing. For example, the impurities may be present in the range of hundreds to thousands ppm.

In an embodiment, the composition may include less than 1.0 wt % of inorganic additive, based on the wt % of the total composition. In an embodiment, the composition may include less than 0.5 wt % of inorganic additive, based on the wt % of the total composition. In a further embodiment, the composition may not include an inorganic additive. In an embodiment, the glass frit mentioned herein may have a softening point between 500-600° C.

TABLE 3

| | Glass Compositions in weight percent (wt %) | | | | | | | |
|---|---|---|---|---|---|---|---|---|
| ID # | $SiO_2$ | $Al_2O_3$ | $B_2O_3$ | $Na_2O$ | $Li_2O$ | $ZrO_2$ | $Bi_2O_3$ | $TiO_2$ |
| 31 | 16.36 | — | 1.92 | 1.20 | 1.20 | 2.71 | 76.62 | — |
| 32 | 11.28 | — | 1.32 | 0.94 | 0.94 | 1.87 | 83.65 | — |
| 33 | 7.66 | — | 0.90 | 0.79 | 0.79 | 1.27 | 88.60 | — |
| 34 | 21.02 | — | 3.70 | 2.31 | 2.31 | 5.23 | 65.43 | — |
| 35 | 21.90 | 0.25 | 3.80 | 1.60 | 1.50 | 4.10 | 64.85 | 2.0 |

The amount of glass frit in the total composition is in the range of 0.1 to 10 wt % of the total composition. In one embodiment, the glass composition is present in the amount of 1 to 8 wt % of the total composition. In a further embodiment, the glass composition is present in the range of 4 to 6 wt % of the total composition.

TABLE 4

| | Glass Compositions in weight percent (wt %) | | | | | | | | | | | | |
|---|---|---|---|---|---|---|---|---|---|---|---|---|---|
| ID # | $SiO_2$ | $Al_2O_3$ | PbO | $B_2O_3$ | CaO | ZnO | MgO | $Na_2O$ | FeO | $Li_2O$ | $ZrO_2$ | $Bi_2O_3$ | $TiO_2$ |
| 36 | 5.01 | 0.37 | 86.09 | 8.17 | — | 0.37 | — | — | — | — | 0.38 | — | — |
| 37 | 13.27 | 0.38 | 85.97 | — | — | — | — | — | — | — | 0.38 | — | — |
| 38 | 17.26 | 9.31 | — | 21.86 | — | 46.81 | — | 1.13 | — | 1.39 | 2.24 | 76.7 | — |
| 39 | 18.41 | 8.99 | — | 18.08 | — | 49.92 | — | 1.09 | — | 1.34 | 2.17 | — | — |
| 40 | 35.70 | 5.47 | — | 11.77 | — | 41.68 | — | 1.82 | — | 2.24 | 1.32 | — | — |
| 41 | 19.8 | — | — | 1.0 | — | — | — | 0.6 | — | 0.6 | 1.4 | 76.7 | — |
| 42 | 16.7 | 7.1 | — | 29.0 | — | 45.2 | — | — | — | 2.1 | — | — | — |
| 43 | 19.8 | 0.3 | 77.5 | 2.0 | — | — | — | — | — | — | 0.5 | — | — |
| 44 | 15.8 | — | 81.9 | 1.8 | — | — | — | — | — | — | 0.4 | — | — |
| 45 | 15.8 | — | 81.6 | 1.9 | — | — | — | 0.1 | — | 0.2 | 0.4 | — | — |
| 46 | 15.7 | 0.4 | 81.0 | 1.9 | — | — | — | 0.2 | — | 0.4 | 0.4 | — | — |
| 47 | 15.7 | 0.4 | 81.3 | 1.9 | — | — | — | 0.1 | — | 0.2 | 0.4 | — | — |
| 48 | 15.8 | 0.2 | 81.5 | 1.9 | — | — | — | 0.1 | — | 0.2 | 0.4 | — | — |
| 49 | 19.7 | 0.2 | 77.6 | 2.0 | — | — | — | — | — | — | 0.5 | — | — |
| 50 | 19.6 | 0.2 | 77.1 | 2.0 | — | — | — | 0.2 | — | 0.4 | 0.5 | — | — |
| 51 | 19.7 | 0.2 | 77.3 | 2.0 | — | — | — | 0.1 | — | 0.2 | 0.5 | — | — |
| 52 | 3.1 | 2.9 | 56.0 | — | 6.3 | 8.9 | 1.0 | — | 21.8 | — | — | — | — |
| 53 | 4.4 | 3.0 | 56.0 | — | 9.1 | 8.9 | 1.3 | — | 17.4 | — | — | — | — |
| 54 | 3.3 | 1.2 | 85.0 | — | 6.8 | 3.0 | 0.7 | — | — | — | — | — | — |
| 55 | 33.4 | 5.5 | — | 9.1 | — | 45.3 | — | — | — | 3.3 | 1.3 | — | — |
| 56 | 28.4 | 5.5 | — | 7.0 | — | 52.3 | — | 2.1 | — | 3.3 | 1.3 | — | — |
| 57 | 13.4 | 5.5 | — | 19.0 | — | 55.4 | — | 2.1 | — | 3.3 | 1.3 | — | — |
| 58 | 10.4 | 5.5 | — | 14.2 | — | 63.2 | — | 2.1 | — | 3.3 | 1.3 | — | — |
| 59 | 27.4 | 5.3 | — | 6.8 | — | 50.4 | — | 5.5 | — | 3.4 | 1.3 | — | — |
| 60 | — | — | 82.8 | 17.2 | — | — | — | — | — | — | — | — | — |
| 61 | 5.1 | — | 86.7 | 8.2 | — | — | — | — | — | — | — | — | — |
| 62 | 4.9 | — | 84.6 | 8.0 | — | — | — | 0.5 | — | — | 2.0 | — | — |
| 63 | 4.9 | — | 84.4 | 8.0 | — | — | — | 0.9 | — | — | 1.8 | — | — |
| 64 | 5.0 | — | 85.9 | 8.2 | — | — | — | 0.3 | — | — | 0.6 | — | — |
| 65 | 3.6 | 0.4 | 84.0 | 11.6 | — | — | — | — | — | — | 0.4 | — | — |
| 66 | 3.5 | 0.4 | 82.7 | 11.5 | — | — | — | 0.6 | — | 1.1 | 0.4 | — | — |
| 67 | 4.9 | 0.4 | 84.7 | 8.0 | — | — | — | 0.5 | — | 1.1 | 0.4 | — | — |
| 68 | 12.2 | 0.3 | — | 4.2 | — | — | — | 2.4 | — | 2.3 | 4.7 | 71.6 | 2.2 |

TABLE 4-continued

Glass Compositions in weight percent (wt %)

| ID # | SiO$_2$ | Al$_2$O$_3$ | PbO | B$_2$O$_3$ | CaO | ZnO | MgO | Na$_2$O | FeO | Li$_2$O | ZrO$_2$ | Bi$_2$O$_3$ | TiO$_2$ |
|---|---|---|---|---|---|---|---|---|---|---|---|---|---|
| 69 | 22.6 | 0.3 | — | 3.9 | — | — | — | — | — | — | 4.2 | 66.9 | 2.1 |
| 70 | 22.4 | 0.3 | — | 3.9 | — | — | — | 0.2 | — | 0.5 | 4.2 | 66.5 | 2.1 |

Conductive Powder

In an embodiment, the thick film composition may include a functional phase that imparts appropriate electrically functional properties to the composition. The functional phase comprises electrically functional powders dispersed in an organic medium that acts as a carrier for the functional phase that forms the composition. The composition is fired to burn out the organic phase, activate the inorganic binder phase and to impart the electrically functional properties. In an embodiment, the electrically functional powder may be a conductive powder.

In an embodiment, the conductive powder may include Ag. In a further embodiment, the conductive powder may include silver (Ag) and aluminum (Al). In a further embodiment, the conductive powder may, for example, include one or more of the following: Cu, Au, Ag, Pd, Pt, Al, Ag—Pd, Pt—Au, etc. In an embodiment, the conductive powder may include one or more of the following: (1) Al, Cu, Au, Ag, Pd and Pt; (2) alloy of Al, Cu, Au, Ag, Pd and Pt; and (3) mixtures thereof.

In an embodiment, the functional phase of the composition may include coated or uncoated silver particles which are electrically conductive. In an embodiment in which the silver particles are coated, they may be at least partially coated with a surfactant. In an embodiment, the surfactant may include one or more of the following non-limiting surfactants: stearic acid, palmitic acid, a salt of stearate, a salt of palmitate, lauric acid, palmitic acid, oleic acid, stearic acid, capric acid, myristic acid and linoleic acid, and mixtures thereof. The counter ion may be, but is not limited to, hydrogen, ammonium, sodium, potassium and mixtures thereof.

The particle size of the silver is not subject to any particular limitation. In an embodiment, the average particle size may be less than 10 microns, and, in a further embodiment, no more than 5 microns. In an aspect, the average particle size may be 0.1 to 5 microns, for example. In an embodiment, the silver powder may be 70 to 85 wt % of the paste composition. In a further embodiment, the silver may be 90 to 99 wt % of the solids in the composition (i.e., excluding the organic vehicle).

Additives

In an embodiment, the thick film composition may include an additive. In an embodiment, the composition may not include an additive. In an embodiment, the additive may be selected from one or more of the following: (a) a metal wherein said metal is selected from Zn, Pb, Bi, Gd, Ce, Zr, Ti, Mn, Sn, Ru, Co, Fe, Cu, and Cr; (b) a metal oxide of one or more of the metals selected from Zn, Pb, Bi, Gd, Ce, Zr, Ti, Mn, Sn, Ru, Co, Fe, Cu and Cr; (c) any compounds that can generate the metal oxides of (b) upon firing; and (d) mixtures thereof.

In an embodiment, the additive may include a Zn-containing additive. The Zn-containing additive may include one or more of the following: (a) Zn, (b) metal oxides of Zn, (c) any compounds that can generate metal oxides of Zn upon firing, and (d) mixtures thereof. In an embodiment, the Zn-containing additive may include Zn resinate.

In an embodiment, the Zn-containing additive may include ZnO. The ZnO may have an average particle size in the range of 10 nanometers to 10 microns. In a further embodiment, the ZnO may have an average particle size of 40 nanometers to 5 microns. In a further embodiment, the ZnO may have an average particle size of 60 nanometers to 3 microns. In a further embodiment the ZnO may have an average particle size of less than 1-nm; less than 90 nm; less than 80 nm; 1 nm to less than 1-nm; 1 nm to 95 nm; 1 nm to 90 nm; 1 nm to 80 nm; 7 nm to 30 nm; 1 nm to 7 nm; 35 nm to 90 nm; 35 nm to 80 nm, 65 nm to 90 nm, 60 nm to 80 nm, and ranges in between, for example.

In an embodiment, ZnO may be present in the composition in the range of 2 to 10 weight percent total composition. In an embodiment, the ZnO may be present in the range of 4 to 8 weight percent total composition. In a further embodiment, the ZnO may be present in the range of 5 to 7 weight percent total composition. In a further embodiment, the ZnO may be present in the range of greater than 4.5 wt %, 5 wt %, 5.5 wt %, 6 wt %, 6.5 wt %, 7 wt %, or 7.5 wt % of the total composition.

In a further embodiment the Zn-containing additive (for example Zn, Zn resinate, etc.) may be present in the total thick film composition in the range of 2 to 16 weight percent. In a further embodiment the Zn-containing additive may be present in the range of 4 to 12 weight percent total composition. In a further embodiment, the Zn-containing additive may be present in the range of greater than 4.5 wt %, 5 wt %, 5.5 wt %, 6 wt %, 6.5 wt %, 7 wt %, or 7.5 wt % of the total composition.

In one embodiment, the particle size of the metal/metal oxide additive (such as Zn, for example) is in the range of 7 nanometers (nm) to 125 nm; in a further embodiment, the particle size may be less than 1-nm, 90 nm, 85 nm, 80 nm, 75 nm, 70 nm, 65 nm, or 60 nm, for example.

Organic Medium

In an embodiment, the thick film compositions described herein may include organic medium. The inorganic components may be mixed with an organic medium, for example, by mechanical mixing to form viscous compositions called "pastes", having suitable consistency and rheology for printing. A wide variety of inert viscous materials can be used as organic medium. In an embodiment, the organic medium may be one in which the inorganic components are dispersible with an adequate degree of stability. In an embodiment, the rheological properties of the medium may lend certain application properties to the composition, including: stable dispersion of solids, appropriate viscosity and thixotropy for screen printing, appropriate wettability of the substrate and the paste solids, a good drying rate, and good firing properties. In an embodiment, the organic vehicle used in the thick film composition may be a nonaqueous inert liquid. The use of various organic vehicles, which may or may not contain thickeners, stabilizers and/or other common additives, is contemplated. The organic medium may be a solution of polymer(s) in solvent(s). In an embodiment, the organic medium may also include one or more components, such as surfactants. In an embodiment, the polymer may be ethyl cellulose. Other exemplary polymers include ethylhydroxyethyl cellulose, wood rosin, mixtures of ethyl cellulose and phenolic resins, polymethacrylates of lower alcohols, and monobutyl ether of ethylene glycol monoacetate, or mixtures thereof. In an embodiment, the solvents useful in thick film compositions described herein include ester alcohols and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In a further embodiment, the organic medium may include volatile liquids for promoting rapid hardening after application on the substrate.

In an embodiment, the polymer may be present in the organic medium in the range of 5 to 20 wt %; or 8 wt. % to 11 wt % of the organic medium, for example. The composition may be adjusted by one of ordinary skill in the art to a predetermined, screen-printable viscosity with the organic medium.

In an embodiment, the ratio of organic medium in the thick film composition to the inorganic components in the dispersion may be dependent on the method of applying the paste and the kind of organic medium used, as determined by one of skill in the art. In an embodiment, the dispersion may include 70-95 wt % of inorganic components and 5-30 wt % of organic medium (vehicle) in order to obtain good wetting.

Description of Method of Manufacturing a Semiconductor Device

An embodiment of the invention relates to thick film composition(s) that may be utilized in the manufacture of a semiconductor device. The semiconductor device may be manufactured by the following method from a structural element composed of a junction-bearing semiconductor substrate and a silicon nitride insulating film formed on a main surface thereof. The method of manufacture of a semiconductor device includes the steps of applying (such as coating and printing) onto the insulating film, in a predetermined shape and at a predetermined position, the composition having the ability to penetrate the insulating film, then firing so that the conductive thick film composition melts and passes through the insulating film, effecting electrical contact with the silicon substrate.

An embodiment of the invention relates to a semiconductor device manufactured from the methods described herein.

In an embodiment, the insulating film may include a silicon nitride film or silicon oxide film. The silicon nitride film may be formed by a plasma chemical vapor deposition (CVD) or thermal CVD process. The silicon oxide film may be formed by thermal oxidation, thermal CFD or plasma CFD.

In an embodiment, the method of manufacture of the semiconductor device may also be characterized by manufacturing a semiconductor device from a structural element composed of a junction-bearing semiconductor substrate and an insulating film formed on one main surface thereof, wherein the insulating layer is selected from a titanium oxide silicon nitride, SiNx:H, silicon oxide, and silicon oxide/titanium oxide film, which method includes the steps of forming on the insulating film, in a predetermined shape and at a predetermined position, a metal paste material having the ability to react and penetrate the insulating film, forming electrical contact with the silicon substrate. The titanium oxide film may be formed by coating a titanium-containing organic liquid material onto the semiconductor substrate and firing, or by a thermal CVD. The silicon nitride film is typically formed by PECVD (plasma enhanced chemical vapor deposition). An embodiment of the invention relates to a semiconductor device manufactured from the method described above.

In an embodiment, the composition may be applied using printing techniques know to one of skill in the art such as screen-printing, for example.

In an embodiment, the electrode formed from the conductive thick film composition(s) may be fired in an atmosphere composed of a mixed gas of oxygen and nitrogen. This firing process removes the organic medium and sinters the glass frit with the Ag powder in the conductive thick film composition. The semiconductor substrate may be single-crystal or multi-crystalline silicon, for example.

Additional substrates, devices, methods of manufacture, and the like, which may be utilized with the thick film compositions described herein are described in US patent application publication numbers US 2006/0231801, US 2006/0231804, and US 2006/0231800, which are hereby incorporated herein by reference in their entireties.

The presence of the impurities would not alter the properties of the glass, the thick film composition, or the fired device. For example, a solar cell containing the thick film composition may have the efficiency described herein, even if the thick film composition includes impurities.

In a further aspect of this embodiment, thick film composition may include electrically functional powders and glass-ceramic frits dispersed in an organic medium. In an embodiment, these thick film conductor composition(s) may be used in a semiconductor device. In an aspect of this embodiment, the semiconductor device may be a solar cell or a photodiode.

EXAMPLES

Used materials in the paste preparation and the contents of each component are as follows.

Glass Property Measurement

The glass frit compositions outlined in Table 1, Table 2 and Table 3 were characterized to determine density, softening point, TMA shrinkage, diaphaneity, and crystallinity. Each glass frit powder in Table I was combined with organic vehicle to make a thick film paste that was printed on a crystalline silicon with an insulating film, fired, and then viewed in cross-section to evaluate the ability of the frit to react and penetrate the insulating film. Additionally, pellets of frit were fired on substrates (for example, glass, alumina, silicon nitride, silicon, and/or silver foil) to evaluate their flow characterizes on these substrates.

Paste Preparation

Paste preparations, in general, were accomplished with the following procedure: The appropriate amount of solvent, medium and surfactant were weighed then mixed in a mixing can for 15 minutes, then glass frits described herein, and optionally metal additives, were added and mixed for another 15 minutes. Since Ag is the major part of the solids of the composition, it was added incrementally to ensure better wetting. When well mixed, the paste was repeatedly passed through a 3-roll mill for at progressively increasing pressures from 0 to 4-psi. The gaps of the rolls were adjusted to 1 mil. The degree of dispersion was measured by fineness of grind (FOG). A typical FOG value is generally equal to or less than 20/10 for conductors.

Test Procedure Efficiency and Results

The solar cells built according to the method described herein were tested for efficiency, as shown in Tables 5 and 6. An exemplary method of testing efficiency is provided below.

In an embodiment, the solar cells built according to the method described herein were placed in a commercial IV tester for measuring efficiencies (NCT-150AA, NPC Co., Ltd.). The Xe Arc lamp in the IV tester was simulated the sunlight with a known intensity and radiate the front surface of the cell. The tester used four contact methods to measure current (I) and voltage (V) at approximately 4-load resistance settings to determine the cell's I-V curve. Efficiency (Eff) was calculated from the I-V curve.

The above efficiency test is exemplary. Other equipment and procedures for testing efficiencies were recognized by one of ordinary skill in the art.

TABLE 5

| Glass ID # | Si wafer | EFF (%) |
|---|---|---|
| 1 | mono | 14.31 |
| 2 | mono | 13.47 |
| 3 | mono | 15.72 |
| 4 | mono | 15.72 |
| 5 | mono | 14.82 |
| 6 | mono | 14.11 |
| 7 | mono | 14.72 |
| 8 | mono | 14.04 |
| 9 | mono | 7.36 |
| 10 | mono | 6.47 |
| 11 | poly | 14.55 |
| 12 | poly | 10.68 |
| 13 | poly | 16.11 |
| 14 | poly | 16.16 |
| 15 | poly | 16.14 |
| 16 | poly | 16.26 |
| 17 | poly | 16.21 |
| 18 | poly | 15.38 |

TABLE 6

| ID # | Si wafer | EFF (%) |
|---|---|---|
| 19 | poly | 15.92 |
| 20 | poly | 15.48 |
| 21 | poly | 15.86 |
| 22 | poly | 15.68 |
| 23 | poly | 15.92 |
| 24 | poly | 15.69 |
| 25 | poly | 12.44 |
| 26 | poly | 15.87 |
| 27 | poly | 15.00 |
| 28 | poly | 15.62 |
| 29 | poly | 10.86 |
| 30 | poly | 12.62 |

Test Procedure of FF and Results

The electrical characteristics (I-V characteristics) of the resulting solar cell substrate with an electrode containing glass ID#31-34 and ID#35 which was a conventional glass composition were evaluated using a model NCT-M-150AA cell tester manufactured by NPC Co. Current-voltage curve (I-V curve) was made with the results of the measurement to calculate Fill factor (FF value). In general, the higher FF value indicates the better electrical generation property in a solar cell. The electrodes formed with glass frit of #31-34 obtained higher FF than that of #35.

The above efficiency test is exemplary. Other equipment and procedures for testing efficiencies were recognized by one of ordinary skill in the art.

TABLE 7

| ID # | FF |
|---|---|
| 31 | 0.74 |
| 32 | 0.55 |
| 33 | 0.54 |
| 34 | 0.76 |
| 35 | 0.41 |

What is claimed is:

1. A composition comprising:
   (a) one or more electrically conductive materials;
   (b) one or more glass frits, wherein one or more of the glass frits comprises, based on the wt % of the glass frit:
      7-25 wt % of $SiO_2$,
      55-90 wt % of $Bi_2O_3$,
      0.5-5 wt % of $B_2O_3$,
      1.5-8 wt % of one or more alkali metal oxides; 1-8 wt % of $ZrO_2$; and
   (c) organic medium.

2. The composition of claim 1, wherein one or more of the glass frits comprises 11-25 wt % of $SiO_2$.

3. The composition of claim 1, wherein the alkali metal oxides are selected from the group consisting of: $Na_2O$, $Li_2O$, and mixtures thereof.

4. The composition of claim 1 wherein the softening point of the glass frit is 500-600° C.

5. The composition of claim 1, further comprising one or more additives selected from the group consisting of: (a) a metal wherein said metal is selected from Zn, Pb, Bi, Gd, Ce, Zr, Ti, Mn, Sn, Ru, Co, Fe, Cu, and Cr; (b) a metal oxide of one or more of the metals selected from Zn, Pb, Bi, Gd, Ce, Zr, Ti, Mn, Sn, Ru, Co, Fe, Cu and Cr; (c) any compounds that can generate the metal oxides of (b) upon firing; and (d) mixtures thereof.

6. The composition of claim 5, wherein at least one of the additives comprises ZnO, or a compound that forms ZnO upon firing.

7. The composition of claim 1, wherein the glass frit is 1 to 6 wt % of the total composition.

8. The composition of claim 1, wherein the conductive material comprises Ag.

9. The composition of claim 8, wherein the Ag is 90 to 99 wt % of the solids in the composition.

10. The composition of claim 6, wherein the ZnO is 2 to 10 wt % of the total composition.

11. A method of manufacturing a semiconductor device comprising the steps of:
   (a) providing a semiconductor substrate, one or more insulating films, and the composition of claim 1;
   (b) applying the insulating film to the semiconductor substrate,
   (c) applying the composition to the insulating film on the semiconductor substrate, and
   (d) firing the semiconductor, insulating film and thick film composition.

12. The method of claim 11, wherein the insulating film comprises one or more components selected from: titanium oxide, silicon nitride, SiNx:H, silicon oxide, and silicon oxide/titanium oxide.

13. A semiconductor device made by the method of claim 11.

14. A semiconductor device comprising an electrode, wherein the electrode, prior to firing, comprises the composition of claim 1.

15. A solar cell comprising the semiconductor device of claim 14.

* * * * *